United States Patent
Makimoto et al.

(10) Patent No.: US 7,804,106 B2
(45) Date of Patent: Sep. 28, 2010

(54) P-TYPE NITRIDE SEMICONDUCTOR STRUCTURE AND BIPOLAR TRANSISTOR

(75) Inventors: Toshiki Makimoto, Kawasaki (JP); Kazuhide Kumakura, Zama (JP); Naoki Kobayashi, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 293 days.

(21) Appl. No.: 10/516,380

(22) PCT Filed: Jan. 6, 2004

(86) PCT No.: PCT/JP2004/000014

§ 371 (c)(1),
(2), (4) Date: Nov. 30, 2004

(87) PCT Pub. No.: WO2004/061971

PCT Pub. Date: Jul. 22, 2004

(65) Prior Publication Data

US 2005/0224831 A1    Oct. 13, 2005

(30) Foreign Application Priority Data

Jan. 6, 2003    (JP) .............................. 2003-000089

(51) Int. Cl.
H01L 33/00    (2010.01)
(52) U.S. Cl. ...................................................... 257/103
(58) Field of Classification Search ......... 257/197–198, 257/280, 472, 471, 473, 474, 477–479, 745, 257/E33.048, E33.025, E33.028, 76–78, 257/102, 183–201, 279, 289; 438/312, 313, 438/572, 573, 604–606, 575, 578
See application file for complete search history.

(56) References Cited

U.S. PATENT DOCUMENTS 6,313,488 B1 *    11/2001    Bakowski et al. ........... 257/198

(Continued)

FOREIGN PATENT DOCUMENTS

JP    5-175225    7/1993

(Continued)

OTHER PUBLICATIONS

K. Kumakura, T. Makimoto and N. Kobayashi, Low-Resistance Nonalloyed Ohmic Contact to p-type GaN Using Strained InGaN Contact Layer, Applied Physics Letters, vol. 79, No. 16, pp. 2588-2590 (2001).*

(Continued)

Primary Examiner—Dao H Nguyen
Assistant Examiner—Tram H Nguyen
(74) Attorney, Agent, or Firm—Workman Nydegger (57) ABSTRACT

A nitride semiconductor structure is provided which greatly improves ohmic characteristics by repairing process damage by regrowing an indium-containing p-type nitride semiconductor on a p-type nitride semiconductor having the process damage. In addition, a nitride semiconductor bipolar transistor is provided which can greatly improve its current gain and offset voltage. The structure includes an indium-containing p-type nitride semiconductor layer on a p-type nitride semiconductor processed by etching. The bipolar transistor, which has a base layer composed of a p-type nitride semiconductor, has an indium-containing p-type InGaN base layer regrown on a surface of a p-type InGaN base layer exposed by etching an emitter layer.

15 Claims, 10 Drawing Sheets

U.S. PATENT DOCUMENTS

| | | | |
|---|---|---|---|
| 6,392,262 | B1* | 5/2002 | Shiraishi .................. 257/280 |
| 2002/0146855 | A1 | 10/2002 | Goto et al. |
| 2002/0195619 | A1* | 12/2002 | Makimoto et al. .......... 257/197 |

FOREIGN PATENT DOCUMENTS

| | | |
|---|---|---|
| JP | 5-291282 | 11/1993 |
| JP | 7-245316 | 9/1995 |
| JP | 11-150296 | 6/1999 |
| JP | 10-065216 | 3/2002 |
| JP | 2002-305204 | 10/2002 |
| JP | 2003-007998 | 1/2003 |

OTHER PUBLICATIONS

K. Kumakura, T. Makimoto and N. Kobayashi, *Low-Resistance Nonalloyed Ohmic Contact to p-type GaN Using Strained InGaN Contact Layer*, Applied Physics Letters, vol. 79, No. 16, pp. 2588-2590 (2001).

T. Makimoto, et al., *Reduced Damage of Electron Cyclotron Resonance Etching by in Doping Into p-GaN*, Journal of Crystal Growth 221, pp. 350-355 (2000).

T. Makimoto, et al., *High Current Gains Obtained by InGaN/GaN Double Heterojunction Bipolar Transistors*, phys. stat. sol. (a) 188, No. 1, pp. 183-186, (2001).

L.S. McCarthy, et al., *AlGaN/GaN Heterojunction Bipolar Transistor*, IEEE Electron Device Letters, vol. 20, No. 6, pp. 277-270 (1999).

B.S. Shelton, et al., *Selective Area Growth and Characterization of AlGaN/GaN Heterojunction Bipolar Transistors by Metalorganic Chemical Vapor Deposition*, IEEE Transactions on Electron Devices, vol. 48, No. 3, pp. 490-494 (2001).

K.P. Lee, et al., *Self-Aligned Process for Emitter- and Base-Regrowth GaN HBTs and BJTs*, Solid-State Electronics 45, pp. 243-247 (2001).

T. Makimoto et al., *High Current Gain of 3000 for GaN/InGaN HBTs with a Regrown Base Layer*, Technical Report of IEICE. ED2003-25 CPM2003-24 SDM2003-25 (May 2003), pp. 49-52.

T. Makimoto et al., *High Current Gain of 3000 for GaN/InGaN Double Heterojunction Bipolar Transistors with Regrown p-InGaN Extrinsic Base*, Technical Digest of 5th International Conference on Nitride Semiconductors, May 25-30, 2003, p. 195.

T. Makimoto et al., *High Current Gain (>2000) and Reduced Common-emitter Offset Voltage of GaN/InGaN Double Heterojunction Bipolar Transistors*, Conference Digest of 61st Device Research Conference, pp. 23-24, Jun. 23-25, 2003.

T. Makimoto et al., *High Current Gain (>2000) of GaN/InGaN double Heterojunction Bipolar Transistors Using Base Regrowth of p-InGaN*. Applied Physics Letters, vol. 83, No. 5, pp. 1035-1037 (2003).

T. Makimoto, et al., *High Current Gains Obtained by InGaN/GaN Double Heterojunction Bipolar Transistors with P-InGaN Base*, Applied Physics Letters, 79, No. 3, pp. 380-381, Jul. 16, 2001.

Supplementary European Search Report of related European Application No. 04700296.9, dated Apr. 6, 2009 (2 pages).

* cited by examiner

FIG. 9A PRIOR ART — CRYSTAL GROWTH OF HBT STRUCTURE

FIG. 9B PRIOR ART — SURFACE EXPOSURE OF BASE LAYER BY ETCHING

FIG. 9C PRIOR ART — SURFACE EXPOSURE OF SUB-COLLECTOR LAYER BY ETCHING

FIG. 9D PRIOR ART — FORMATION OF p-TYPE ELECTRODE ON BASE LAYER

FIG. 9E PRIOR ART — FORMATION OF n-TYPE ELECTRODES ON EMITTER LAYER AND SUB-COLLECTOR LAYER

21: n-TYPE GaN EMITTER LAYER
22: p-TYPE InGaN BASE LAYER
23: n-TYPE COLLECTOR LAYER
24: n-TYPE SUB-COLLECTOR LAYER
25: p-TYPE ELECTRODE
26: n-TYPE ELECTRODE

FIG. 10

P-TYPE NITRIDE SEMICONDUCTOR STRUCTURE AND BIPOLAR TRANSISTOR

TECHNICAL FIELD

The present invention relates to a p-type nitride semiconductor structure and bipolar transistor, and more particularly to a p-type nitride semiconductor structure having nitride semiconductors, and a p-type nitride semiconductor bipolar transistor used for high-output power amplifiers and the like.

BACKGROUND ART

Generally, nitride semiconductors are widely used for various optoelectronic devices because of their characteristics of having a wide band gap. Surfaces of p-type nitride semiconductors processed by etching or the like suffer damage because of the processing. Since the damage exhibits n-type conductivity, the processed p-type nitride semiconductors cannot achieve good ohmic current-voltage (I-V) characteristics even if ohmic electrodes are formed on the surfaces of the p-type nitride semiconductors (for example, refer to non-patent document 1, T. Makimoto, K. Kumakura, and N. Kobayashi, Journal of Crystal Growth 221, pp. 350-355, (2000); non-patent document 2, T. Makimoto, K. Kumakura, and N. Kobayashi, phys. stat. sol. (a) 188, No. 1, pp. 183-186, (2001)).

To reduce the effect of the damage, a method is reported of growing a new p-type semiconductor on the layer that suffers the damage. Here, studies concerning an npn-type nitride semiconductor heterojunction bipolar transistor (HBT) having a base layer consisting of a p-type nitride semiconductor will be mainly described.

Figure 9A:
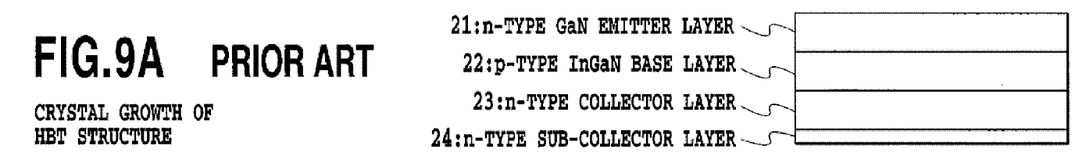
FIGS. 9A-9E are views showing an example of a typical conventional process (without the regrowth) of fabricating an HBT.
Figure 9B:
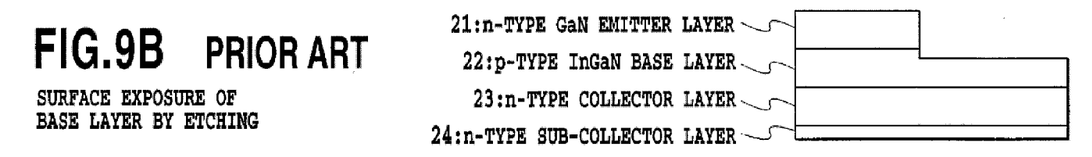
Figure 9C:
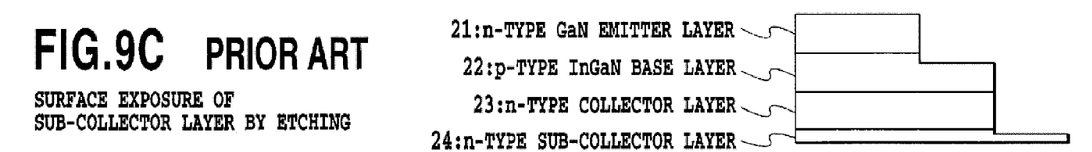
Figure 9D:
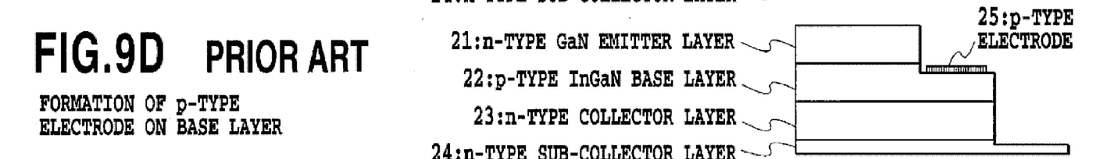
Figure 9E:
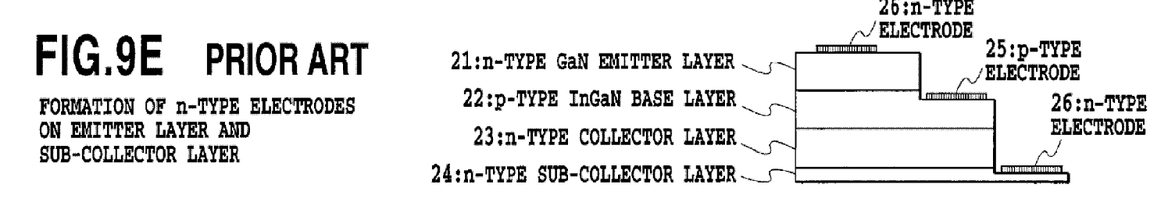

FIGS. 9A-9E are views showing a typical process of fabricating an HBT: FIG. 9A shows crystal growth of the HBT structure; FIG. 9B shows surface exposure of the base layer by etching; FIG. 9C shows surface exposure of the sub-collector layer by etching; FIG. 9D shows forming of a p-type electrode on the base layer; and FIG. 9E shows forming of n-type electrodes on the emitter layer and sub-collector layer.

As shown FIG. 9A, the HBT structure has an n-type sub-collector layer 24, an n-type collector layer 23 stacked on the n-type sub-collector layer 24, a p-type InGaN base layer 22 stacked on the n-type collector layer 23, and an n-type GaN emitter layer 21 stacked on the p-type InGaN base layer 22. Subsequently, as shown in FIG. 9B, the surface exposure of the base layer 22 is carried out by etching. Then, as shown in FIG. 9C, the surface exposure of the n-type sub-collector layer 24 is carried out by etching. Subsequently, as shown in FIG. 9D, a p-type electrode (base electrode) 25 is formed on the base layer 22 whose surface is exposed. Finally, as shown in FIG. 9E, n-type electrodes 26 are formed on the emitter layer 21 and the n-type sub-collector layer 24 whose surface is exposed.

In the HBT fabrication process, the surface of the base layer 22 is exposed by removing the emitter layer 21 by etching to form the base electrode 25. The base electrode 25 is formed on the surface of the exposed base layer 22. Since the surface of the exposed base layer 22 suffers the etching damage, the base electrode does not exhibit good ohmic I-V characteristics, when the base layer 22 is p-type GaN. As a result, the fabricated HBT does not exhibit good common emitter I-V characteristics.

In other words, the conventional nitride HBT has the common emitter I-V characteristics that present a problem of having a small current gain and a high offset voltage. To reduce the effect of the damage of the surface of the base layer, several methods are reported of growing a new p-type semiconductor on the p-type nitride semiconductor base layer that suffers the damage.

The conventional methods will be described.

A first method of reducing the effect of the damage is that of regrowing a p-type GaN on the surface that suffers the damage (for example, see, non-patent document 3, L. S. McCarthy, P. Kozodoy, M. J. W. Rodwell, S. P. DenBaars, and U. K. Mishra, IEEE Electron Device Letters, Vol. 20, No. 6, pp. 277-279 (1999); or non-patent document 4, B. S. Shelton, D. J. H. Lambert, Jian Jang Huang, M. M. Wong, U. Chowdhury, Ting Gang Zhu, H. K. Kwon, Z. Liliental-Weber, M. Benarama, M. Feng, and R. D. Dupuis, IEEE Transactions on Electron Devices, Vol. 48, No. 3, pp. 490-494 (2001)).

Figure 10:
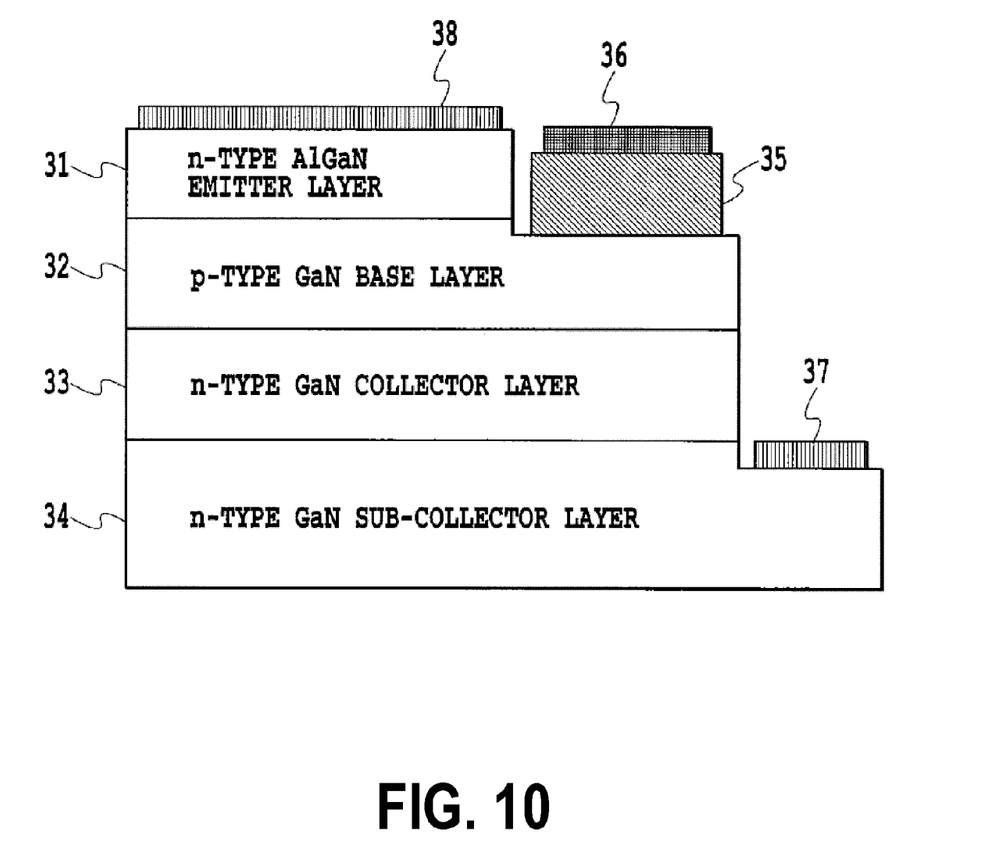
FIG. 10 is a schematic view showing a conventional HBT structure in the case where p-type GaN is regrown on p-type GaN that suffers etching damage.

FIG. 10 is a schematic view showing a conventional HBT structure that has a p-type GaN regrown on the p-type GaN base layer that suffers the etching damage, that is, a schematic view showing a conventional HBT structure that has a new p-type semiconductor grown on the p-type nitride semiconductor base layer. The HBT structure has an n-type GaN sub-collector layer 34, an n-type GaN collector layer 33 stacked on the n-type GaN sub-collector layer 34, a p-type GaN base layer 32 stacked on the n-type GaN collector layer, an n-type AlGaN emitter layer 31 stacked on the p-type GaN base layer 32, and an external regrown p-type GaN base layer 35 formed on the p-type GaN base layer 32 whose surface is exposed. In addition, the HBT structure has a collector electrode 37 formed on the n-type GaN sub-collector layer 34 whose surface is exposed, a base electrode 36 formed on the external regrown p-type GaN base layer 35, and an emitter electrode 38 formed on the n-type AlGaN emitter layer 31.

In spite of the regrowth of the base layer, however, none of the methods disclosed in the foregoing non-patent documents can achieve the HBT current gain larger than 10, which shows that a large gain cannot be achieved.

In addition, in the foregoing non-patent document 3, the offset voltage in the common emitter I-V characteristics is equal to or larger than 4 V. Furthermore, as for the foregoing non-patent document 4, the offset voltage cannot be determined because the common emitter I-V characteristics reported have a large leakage current.

As described above, the regrowth of the p-type GaN (sometimes referred to as an "external base layer") on the base layer exposed by etching can little improve the HBT characteristics. The regrowth using the p-type GaN, a typical example of the p-type nitride semiconductors, is considered to be unable to improve the HBT characteristics because the process damage at the regrowth interface cannot be recovered. This teaches that a material to be regrown is important to fabricate good HBTs.

A second method regrows a p-type GaAs on the surface that suffers the damage instead of regrowing the p-type GaN (for example, refer to a non-patent document 5, K. P. Lee, A. P. Zhang, G. Dang, F. Ren, J. Han, S. N. G. Chu, W. S. Hobson, J. Lopata, C. R. Abernathy, S. J. Pearton, and J. W. Lee, Solid-State Electronics 45, pp. 243-247 (2001)). The hole concentration of the p-type GaAs is $10^{20}$ cm$^{-3}$, which is 100 times or more higher than the hole concentration of the p-type GaN in the room temperature. The document 5 is a report that pays attention to such a high hole concentration to achieve the good HBT characteristics.

The regrowth of the p-type GaAs, however, cannot achieve the current gain larger than 5 and the offset voltage less than 3.5 V in the common emitter I-V characteristics, thereby being unable to achieve the good HBT characteristics. In this case also, the HBT characteristics are considered to be unimproved because the process damage between the p-type GaN base layer and the p-type GaAs grown layer has not been repaired. This teaches that a good HBT cannot be fabricated by only increasing the hole concentration of the layer regrown on the p-type GaN that suffers the process damage.

As relevant patent documents, Japanese patent application laid-open Nos. 5-175225 (1993) and 5-291282 (1993) are known. The documents disclose a technique that regrows a p-type GaAs external base layer on an AlGaAs external emitter layer whose resistance is increased, to reduce the junction capacitance. In addition, Japanese patent application laid-open No. 7-245316 (1995) discloses a device that has a p-type GaAs external base layer on an n-type GaAs collector layer via an n-type InGaP etching stopper layer.

The present invention is implemented to solve the foregoing problems. Therefore it is an object of the present invention to provide a p-type nitride semiconductor structure capable of forming a good ohmic electrode by solving a problem in that it is difficult to form the good ohmic electrode on the surface of the p-type nitride semiconductor processed.

Another object of the present invention is to provide a p-type nitride semiconductor bipolar transistor having a greatly improved current gain by solving a problem in that the conventional p-type nitride semiconductor bipolar transistors have a current gain much smaller than the current gain of the bipolar transistors fabricated from other semiconductors.

Still another object of the present invention is to provide a p-type nitride semiconductor bipolar transistor capable of reducing the offset voltage to a value close to the value expected from the band gaps of emitter and base materials by solving a problem in that the conventional p-type nitride semiconductor bipolar transistor has a offset voltage much larger than the value expected from the band gaps.

DISCLOSURE OF THE INVENTION

According to one aspect of the present invention, there is provided a p-type nitride semiconductor structure having an indium-containing p-type nitride semiconductor layer on a p-type nitride semiconductor processed by etching.

According to another aspect of the present invention, there is provided a p-type nitride semiconductor bipolar transistor having a p-type nitride semiconductor base layer, wherein the bipolar transistor includes an indium-containing p-type nitride semiconductor layer on a surface of the p-type base layer, which is exposed by etching an emitter layer.

In other words, the major characteristic of the present invention is that it has a structure in which the indium-containing p-type nitride semiconductor is regrown on the p-type nitride semiconductor processed. It differs from the conventional technique in that the regrown p-type nitride semiconductor contains In.

Growing the indium-containing p-type nitride semiconductor on the p-type nitride semiconductor that suffers the process damage makes it possible to achieve a good regrowth interface because of the In atoms, thereby being able to greatly reduce the process damage. As a result, good ohmic electrodes can be formed. Applying the present invention to the regrowth of the external p-type base layer of the bipolar transistor can reduce the base leakage current caused by the process damage. As a result, it can achieve the marked improvement of the current gain and the low offset voltage.

BEST MODE FOR CARRYING OUT THE INVENTION

The best mode for carrying out the invention will now be described with reference to the accompanying drawings.

Figure 1:
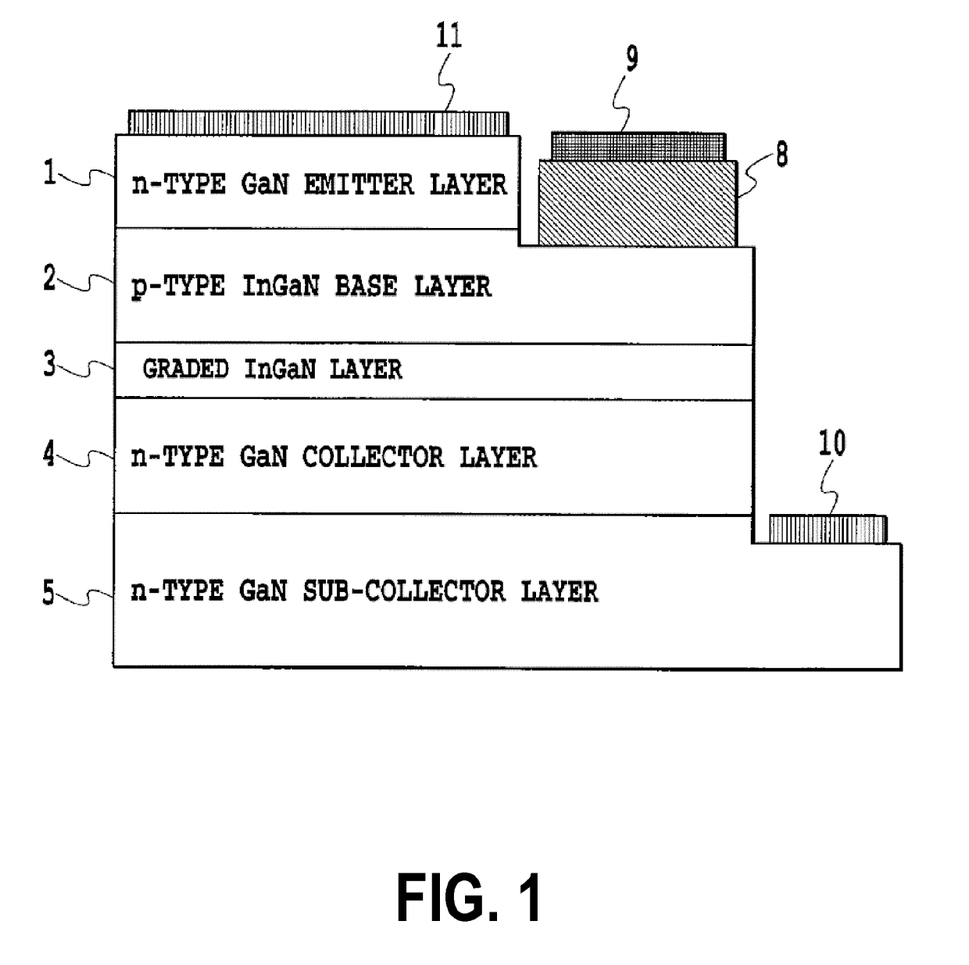
FIG. 1 is a schematic view showing an HBT structure in accordance with the present invention.

FIG. 1 is a schematic view showing an HBT structure in accordance with the present invention, a structural view of a p-type nitride semiconductor bipolar transistor.

The HBT structure has an n-type GaN sub-collector layer 5, an n-type GaN collector layer 4 stacked on the n-type GaN sub-collector layer 5, a graded InGaN layer 3 stacked on the n-type GaN collector layer 4, a p-type InGaN base layer 2 stacked on the graded InGaN layer 3, an n-type GaN emitter layer 1 stacked on the p-type InGaN base layer 2, and an external regrown p-type InGaN base layer 8 formed on the p-type InGaN base layer 2 whose surface is exposed. In addition, the HBT structure has a collector electrode 10 formed on the n-type GaN sub-collector layer 5 whose surface is exposed, a base electrode 9 formed on the external regrown p-type InGaN base layer 8, and an emitter electrode 11 formed on the n-type GaN emitter layer 1.

The HBT, which is a p-type nitride semiconductor HBT having the base layer 2 composed of a p-type nitride semiconductor, has the p-type nitride semiconductor layer 8 that contains In and is grown on the surface of the p-type base layer 2 which is exposed by etching the emitter layer 1. The p-type base layer 2 in accordance with the present invention is p-type InGaN containing In.

A fabrication method of the HBT in accordance with the present invention will now be described.

Figure 2:
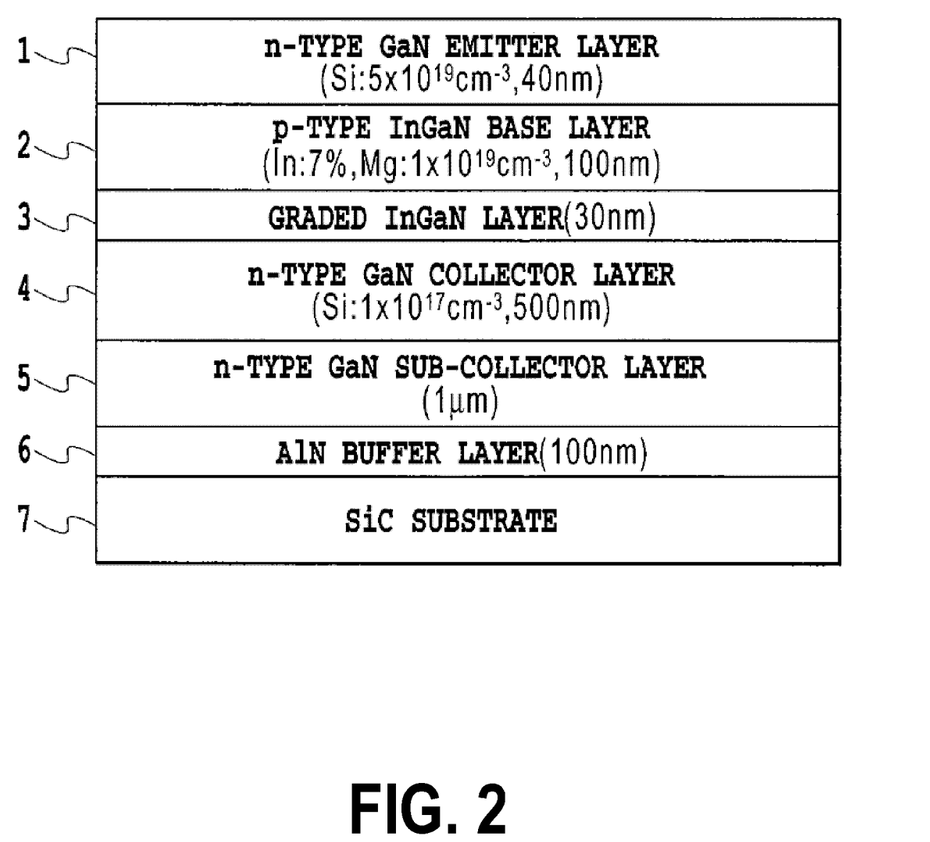
FIG. 2 is a schematic view showing a layer structure of an npn-type HBT used by an embodiment.

First, an npn-type HBT is fabricated on a SiC substrate 7 using metalorganic vapor phase epitaxy (MOVPE). FIG. 2 is a schematic view showing a grown layer structure. The emitter layer 1 is composed of n-type GaN (Si: $5 \times 10^{19}$ cm$^{-3}$, 40 nm); the base layer 2 is composed of p-type InGaN (In: 7%, Mg: $1 \times 10^{19}$ cm$^{-3}$, 100 nm); the graded layer 3 is composed of InGaN (30 nm); the collector layer 4 is composed of n-type GaN (Si: $1 \times 10^{17}$ cm$^{-3}$, 500 nm); the sub-collector layer 5 is composed of n-type GaN (1 μm); the buffer layer 6 is composed of AlN (100 nm); and the substrate 7 is composed of SiC. The collector layer 4 was grown at 1000° C. using trimethylgallium and ammonia. The graded InGaN layer 3, base layer 2, and emitter layer 1 were grown at 780° C. using trimethylindium, triethyl gallium and ammonia. Mg atoms were used as the p-type impurity, and Si atoms were used as the n-type impurity. The In mole fraction in the InGaN was measured using X-ray diffraction measurements (XRD by applying Vegard's law under the assumption that the InGaN crystals were completely relaxed.

When the In mole fraction in the p-type InGaN which constitutes the base layer 2 increases, the lattice constant difference between the p-type InGaN and GaN increases, and hence the defect density increases. As a result, the life time of the minority carrier is shortened, which will reduce the current gain. Thus, the present embodiment sets the In mole fraction of the p-type InGaN at a rather small value of about 7%. In contrast with this, a small In mole fraction will increase the effect of the process damage (see, non-patent document 1, for example). Accordingly, it is considered that there is a tradeoff between the current gain and process damage. In view of this, the In mole fraction of the p-type InGaN base layer 2 is preferably from 5% to 30%, and the In mole fraction of the p-type nitride semiconductor layer 8 is preferably higher than that of the p-type InGaN base layer 2.

In addition, if the p-type InGaN base layer 2 is simply joined to the n-type GaN collector layer 4, potential spikes will occur between the base layer 2 and collector layer 4 because of the conduction band discontinuity. The potential spikes will reduce the current gain because they hinder the electrons injected from the emitter layer 1 to the base layer 2 from moving toward the collector layer 4. To eliminate such effect, the graded InGaN layer 3 whose In mole fraction is gradually varied is inserted between the base layer 2 and collector layer 4.

First, the HBT layer structure as shown in FIG. 2 was processed by dry etching (reactive ion etching) using chlorine-containing gases to expose the surface of the base layer 2 and that of the sub-collector layer 5.

Subsequently, regions at which the regrowth of the p-type nitride semiconductor layer 8 is to be avoided are covered with a $SiO_2$ mask. Then, the p-type InGaN external base layer 8 was regrown on the p-type InGaN base layer 2 using trimethylindium, triethylgallium, cyclopentadienyl magnesium (source gas of Mg atoms) and ammonia. Since, it is preferable that the growth temperature of the regrowth be lower than the growth temperature of the base layer 2 (which is 780° C. in the present embodiment), it is set at 750° C. in the present embodiment.

Figure 3:
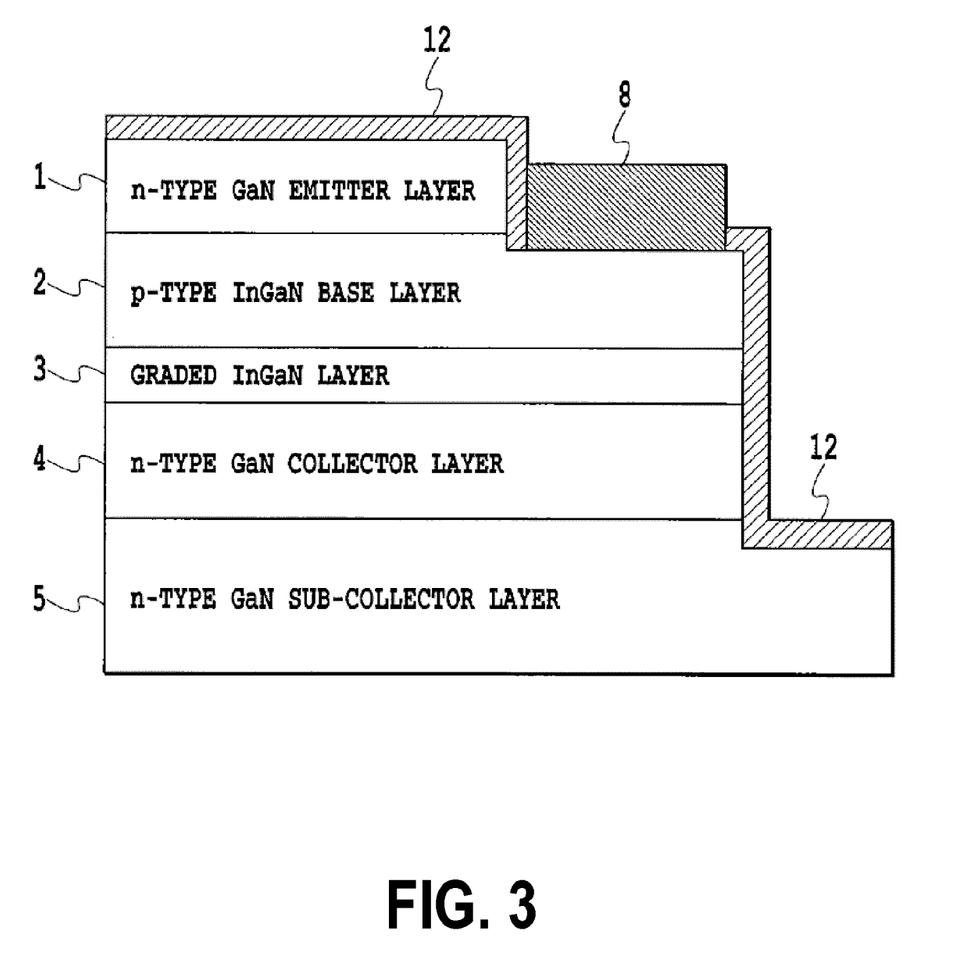
FIG. 3 is a schematic view showing a state after the regrowth of a p-type InGaN external base layer.

The In mole fraction of the p-type InGaN external base layer 8 to be regrown is preferably higher than the In mole fraction of the p-type InGaN layer 2. FIG. 3 is a schematic view showing a state after the regrowth. Afterward, the $SiO_2$ mask 12 was removed with HF, followed by forming the individual electrodes (base electrode 9, collector electrode 10 and emitter electrode 11) by electron beam evaporation. In this way, the HBT as shown in FIG. 1 was finally fabricated. In this case, the size of the emitter electrode 11 is 50 μm×30 μm.

Figure 4:
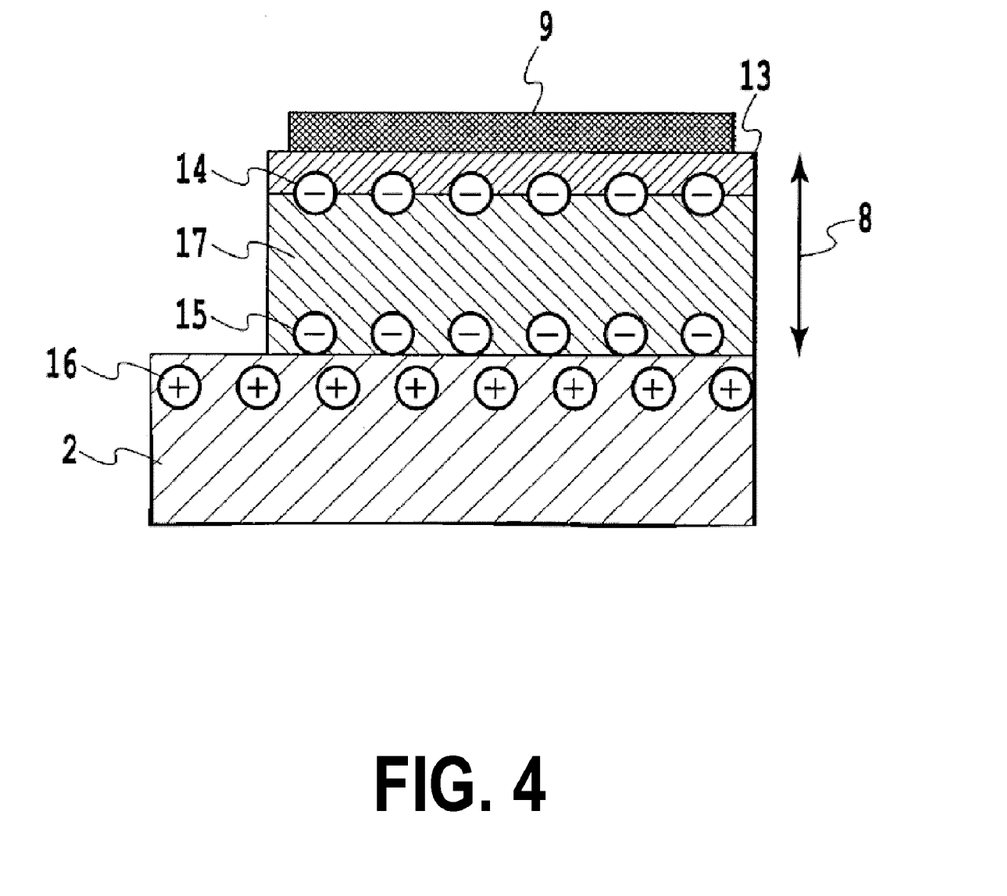
FIG. 4 is a diagram showing details near the regrown p-type InGaN external base layer in the embodiment.

FIG. 4 shows a detailed structure of the p-type InGaN external base layer 8 regrown in the present embodiment. On the p-type InGaN base layer 2 exposed by etching, a 100 nm thick p-type InGaN layer 17 with the In mole fraction of 20% was regrown, followed by growing a thin p-type InGaN layer 13 with a thickness of 2 nm and the In mole fraction of 30%. The Mg concentration contained in the regrown p-type InGaN layers is $4\times10^{19}$ $cm^{-3}$. In the present example, between the thin p-type InGaN layer 13 whose In mole fraction is 30% and p-type InGaN layer 17 whose In mole fraction 20%, polarization charge 14 occurs because of the distortion of crystals. The nitride semiconductor is characterized by having large polarization charge. In contrast, GaAs-based or InP-based compound semiconductors have only negligible polarization charge. When the InGaN with a higher In mole fraction is grown on the InGaN with a lower In mole fraction, negative polarization charge takes place at the interface. Utilizing the property makes it possible to reduce the contact resistance between the p-type nitride semiconductor and a metal (see, Japanese patent application laid-open No. 2003-007998 "low-resistance nitride semiconductor and its fabrication method" by Kumakura, Makimoto and Kobayashi, for example, or non-patent document 6: K. Kumakura, T. Makimoto and N. Kobayashi, Applied Physics Letters, Vol. 79, No. 16, pp. 2588-2590 (2001)).

In other word, the thin p-type InGaN layer 13 plays a role of only reducing the contact resistance with a metal, and the foregoing documents do not disclose the substance of the present invention. In contrast with this, it should be noted that the regrowth of the p-type InGaN layer 17 with the thickness of 100 nm and the In mole fraction of 20% on the p-type InGaN base layer 2 is the subject matter of the present invention.

It is preferable that the p-type InGaN external base layer 17 with the In mole fraction of 20% have the Mg concentration higher than the p-type InGaN base layer 2 with the In mole fraction of 7%. On the other hand, it is known that too high Mg concentration brings about reduction in the hole carrier concentration. In view of this, it is preferable that the Mg concentration be from $1\times10^{19}$ $cm^{-3}$ to $2\times10^{20}$ $cm^{-3}$. In addition, if the p-type InGaN external base layer 17 with the In mole fraction of 20% is too thin, the effect of the regrowth cannot be expected, and if it is too thick, it will hamper the device fabrication. Accordingly, its thickness is preferably from 1 nm to 1000 nm.

As shown in FIG. 4, defects due to etching bring about positive charges 16 on the p-type InGaN base layer 2. The positive charges 16 cause the deterioration in the ohmic characteristics. In the present embodiment, although the p-type InGaN external base layer 17 whose In mole fraction is 20% is not distorted completely, a certain degree of negative polarization charges 15 are expected to occur between the layer 17 and the p-type InGaN base layer 2 whose In mole fraction is 7%. The negative charges 15 are expected to improve the ohmic characteristics by canceling out the positive charges 16 due to the defects. Accordingly, it is preferable that the regrown p-type InGaN external base layer 17 have an In mole fraction higher than that of the p-type InGaN base layer 2.

Two Pd/Au electrodes 9 were formed on the p-type InGaN external base layer 8 which was regrown in the present embodiment, and the I-V characteristics across the two electrodes were measured. The size of the electrodes is 50 μm×80 μm, and their distance is 20 μm. The regrown base layer 8 is not regrown in regions where the electrodes are not formed. Thus, all the current passes through the interface between the p-type InGaN base layer 2 whose In mole factor is 7% and the regrown p-type InGaN external base layer 17 whose In mole factor is 20%.

Figure 5:
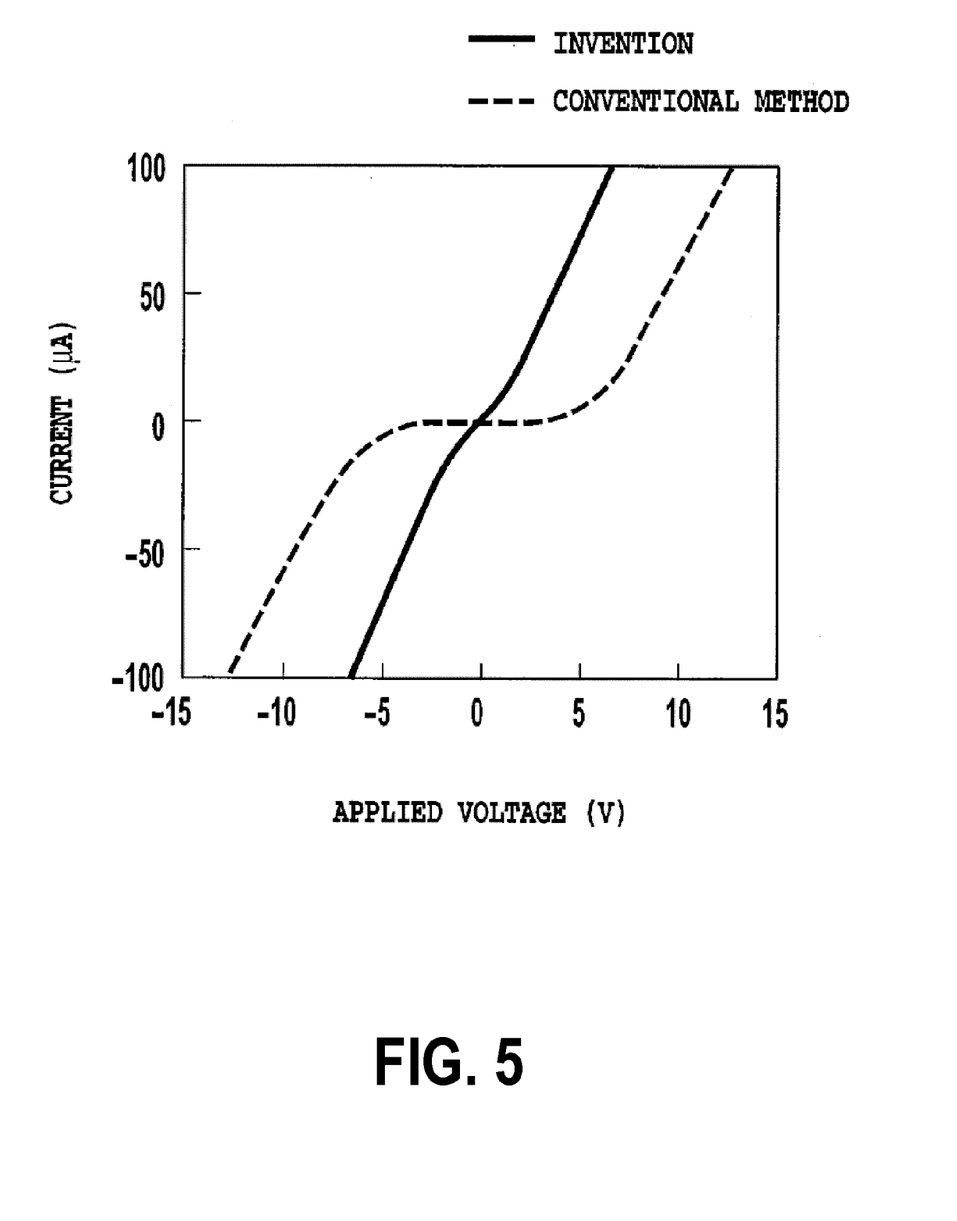
FIG. 5 is a comparative graph illustrating I-V characteristics in the case where the p-type InGaN is regrown (the present invention), and the I-V characteristics in the case where it is not regrown (conventional structure)

FIG. 5 is a comparative graph illustrating the I-V characteristics when the p-type InGaN external base layer 8 is regrown (embodiment) and the I-V characteristics when it is not regrown (conventional method). The conventional method cannot achieve good ohmic characteristics because of the etching damage. In contrast with this, it is seen that the I-V characteristics are greatly improved in the present embodiment that regrows the p-type InGaN external base layer 8.

A conventional HBT was fabricated through a typical HBT process of FIG. 9 without applying the present invention.

Figure 6:
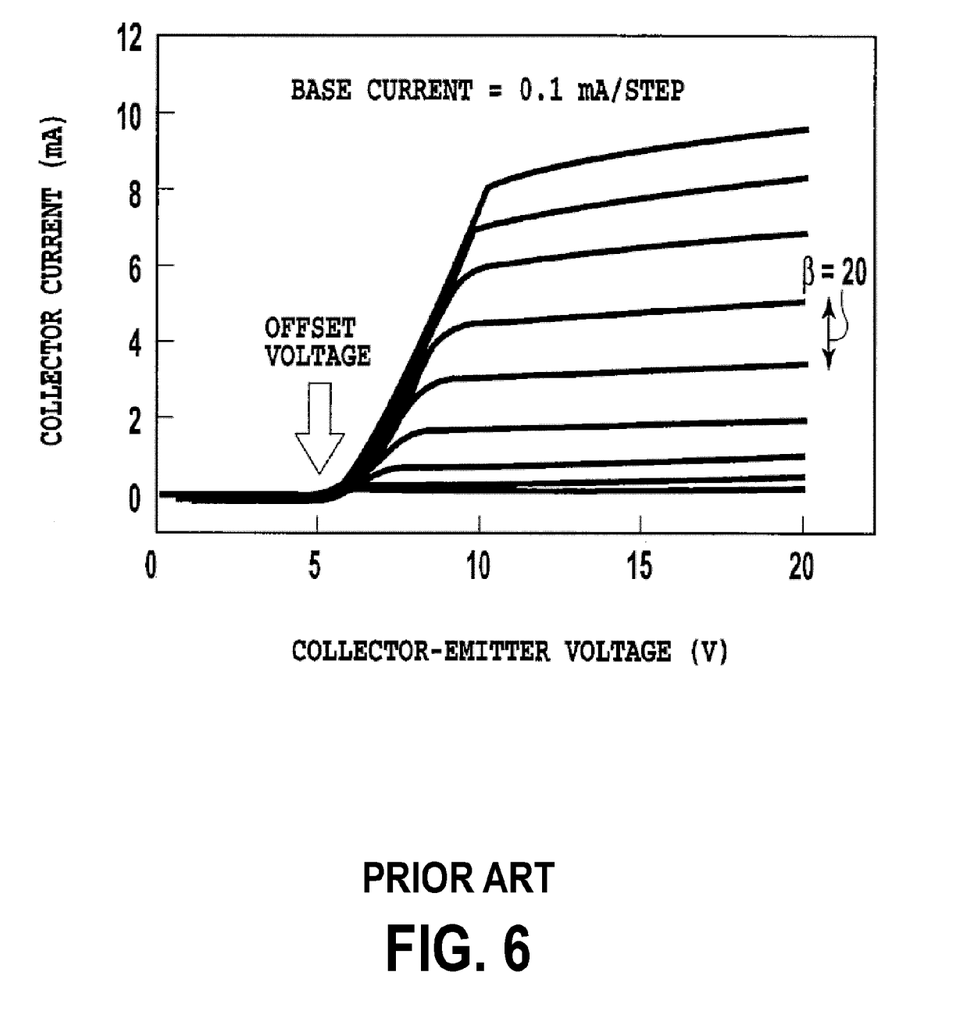
FIG. 6 is a graph illustrating an example of the common emitter I-V characteristics of an HBT fabricated by a conventional method.

FIG. 56 illustrates an example of the common emitter I-V characteristics introduced in the non-patent document 2. The HBT, which employs the p-type InGaN layer as the base layer, has lesser process damage than the HBT using the p-type GaN. Nevertheless, the maximum value of the current gain is about 20, and the offset voltage is about 6V. The deviation of the offset voltage from the expected value is not less than 5 V.

Figure 7:
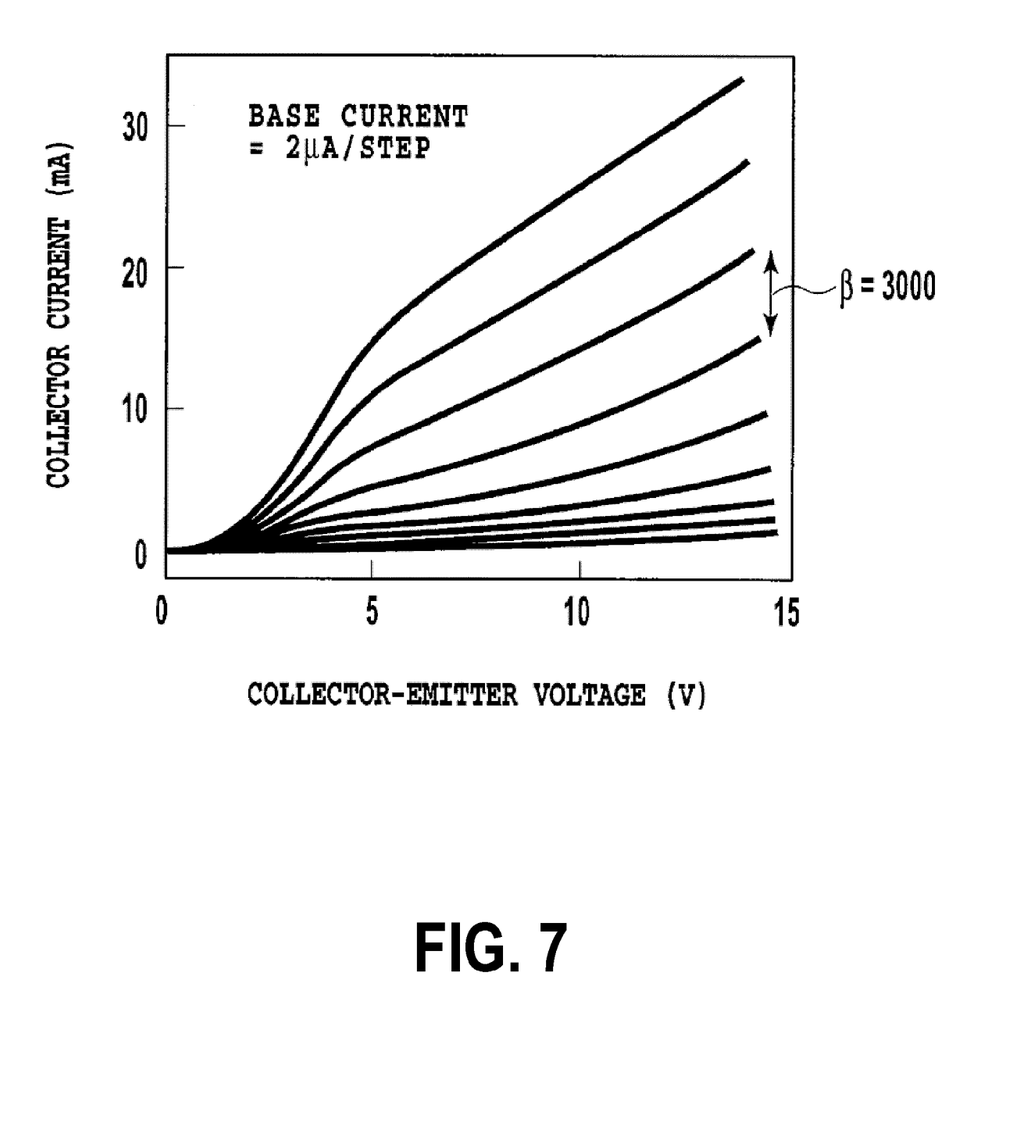
FIG. 7 is a graph illustrating an example of the common emitter I-V characteristics of an HBT of the embodiment.
Figure 8:
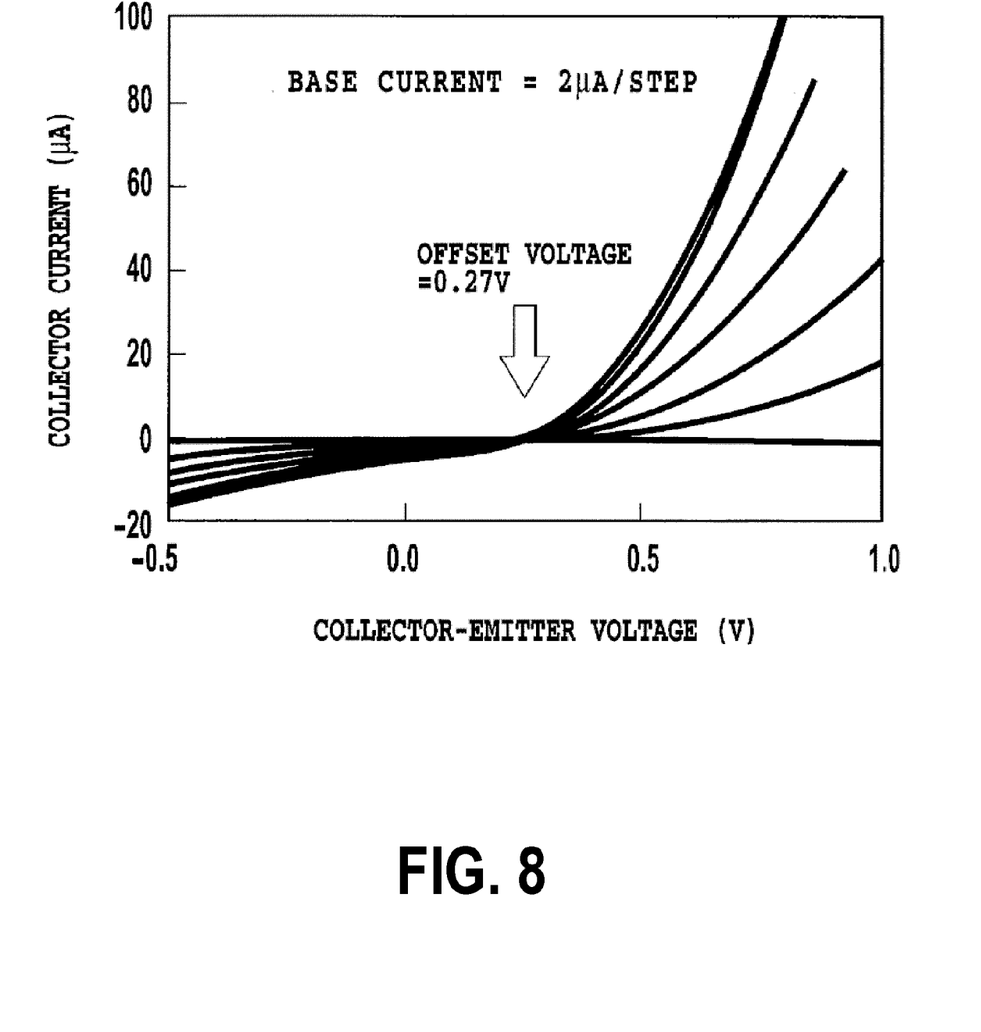
FIG. 8 is a graph illustrating an example of the common emitter I-V characteristics measured using a small current to check a offset voltage.

On the other hand, the HBT common emitter I-V characteristics of the present embodiment is illustrated in FIG. 7. The maximum value of the current gain is equal to or greater than 3000. FIG. 8 illustrates the common emitter I-V characteristics measured at small currents to check the offset voltage. As can be seen from FIG. 8, the offset voltage is 0.27 V. The conduction band discontinuity between the n-type GaN emitter layer 1 and the p-type InGaN base layer 2 whose In mole fraction is 7% is 0.2 V. Thus, the offset voltage nearly equal to the discontinuity can be achieved. The deviation of the offset voltage from the expected value is not more than 0.1 V. In this way, compared with the HBT fabricated by the conventional method, the HBT of the present embodiment can sharply increase the current gain by a factor of 100 and more, and greatly reduce the deviation of the offset voltage from the expected value to less than 1/50.

As described above, using the p-type InGaN external base layer 8 as the regrowth layer makes it possible to greatly improve the HBT characteristics. The reason for this is considered that the In atoms contained in the p-type nitride semiconductor repair the process damage.

INDUSTRIAL APPLICABILITY

As described above, according to the present invention, the process damage is restored by regrowing the indium-containing p-type nitride semiconductor on the p-type nitride semiconductor having the process damage. This can greatly improve the ohmic characteristics. As a result, applying the present invention to the HBT base layer offers an advantage of being able to greatly improve the current gain and the offset voltage.

What is claimed is:

1. A nitride semiconductor structure comprising on a substrate:
an n-type collector layer;
a p-type base layer formed over said n-type collector layer, wherein said p-type base layer is p-type InGaN;
an n-type emitter layer formed directly on a first portion of a top surface of said p-type base layer;
an indium-containing p-type nitride semiconductor layer formed directly on a second portion of said top surface of said p-type base layer, wherein said n-type emitter layer is not formed on the second portion, and said indium-containing p-type nitride semiconductor layer has an indium mole fraction that is higher than an indium mole fraction of said p-type InGaN base layer, and does not contact said n-type emitter layer; and
a base electrode formed over said indium-containing p-type nitride semiconductor layer.

2. The nitride semiconductor structure according to claim 1, wherein said indium-containing p-type nitride semiconductor layer is p-type InGaN.

3. The nitride semiconductor structure according to claim 2, wherein said p-type InGaN base layer has an indium mole fraction of 5-30%.

4. The nitride semiconductor structure according to claim 1, wherein said p-type InGaN base layer has an indium mole fraction of 5-30%.

5. The nitride semiconductor structure according to claim 1, further comprising a graded layer between said p-type base layer and said n-type collector layer, wherein said graded layer has an indium mole fraction that varies gradually.

6. The nitride semiconductor structure according to claim 2, further comprising a graded layer between said p-type base layer and said n-type collector layer, wherein said graded layer has an indium mole fraction that varies gradually.

7. The nitride semiconductor structure according to claim 1, wherein the base electrode is formed directly on said indium-containing p-type nitride semiconductor layer.

8. A nitride semiconductor structure comprising:
an n-type collector layer;
a p-type base layer formed over said n-type collector layer, wherein said p-type base layer is p-type InGaN;
an n-type emitter layer formed directly on a first portion of a top surface of said p-type base layer;
an indium-containing p-type nitride semiconductor layer formed directly on a second portion of said top surface of the p-type base layer which has been exposed by dry etching, wherein said indium-containing p-type nitride semiconductor layer has an indium mole fraction that is higher than an indium mole fraction of said p-type InGaN base layer, and does not contact said n-type emitter layer; and
a base electrode formed over said indium-containing p-type nitride semiconductor layer.

9. The nitride semiconductor structure according to claim 8, wherein said indium-containing p-type nitride semiconductor layer comprises p-type InGaN.

10. The nitride semiconductor structure according to claim 8, further comprising a graded layer between said p-type base layer and said n-type collector layer.

11. The nitride semiconductor structure according to claim 1, wherein said indium-containing p-type nitride semiconductor layer has a thickness of between 1 and 1000 nm.

12. The nitride semiconductor structure according to claim 1, wherein said indium-containing p-type nitride semiconductor layer has a thickness of about 100 nm.

13. The nitride semiconductor structure according to claim 8, wherein said indium-containing p-type nitride semiconductor layer has a thickness of between 1 and 1000 nm.

14. The nitride semiconductor structure according to claim 8, wherein said indium-containing p-type nitride semiconductor layer has a thickness of about 100 nm.

15. The nitride semiconductor structure according to claim 8, wherein the base electrode is formed directly on said indium-containing p-type nitride semiconductor layer.

* * * * *